(12) United States Patent
Guo

(10) Patent No.: US 11,169,407 B2
(45) Date of Patent: Nov. 9, 2021

(54) SELF-CONDUCTING LIGHT VALVE MODULE AND LIGHT VALVE HEAT DISSIPATION DEVICE

(71) Applicant: NANHUA INTELLIGENT PRECISION MACHINE (SHENZHEN) CO., LTD., Guangdong (CN)

(72) Inventor: Hanwen Guo, Jiangsu (CN)

(73) Assignee: NANHUA INTELLIGENT PRECISION MACHINE (SHENZHEN) CO., LTD., Guangdong (CN)

( * ) Notice: Subject to any disclaimer, the term of this patent is extended or adjusted under 35 U.S.C. 154(b) by 0 days.

(21) Appl. No.: 16/926,778

(22) Filed: Jul. 13, 2020

(65) Prior Publication Data

US 2020/0341328 A1 Oct. 29, 2020

(30) Foreign Application Priority Data

Mar. 9, 2020 (CN) .......................... 202010159916.7

(51) Int. Cl.
*G02F 1/1333* (2006.01)
*G02F 1/1335* (2006.01)
(Continued)

(52) U.S. Cl.
CPC ........ *G02F 1/133382* (2013.01); *C08K 3/042* (2017.05); *G02F 1/133528* (2013.01);
(Continued)

(58) Field of Classification Search
CPC ........... G02F 1/133382–133385; G03B 21/16; H04N 9/3141–3144; H05K 7/2039; H05K 7/20963; H05K 1/0204
See application file for complete search history.

(56) References Cited

U.S. PATENT DOCUMENTS

2006/0290251 A1* 12/2006 Shives .............. G02F 1/133382
313/46
2006/0292461 A1* 12/2006 Shives .............. G02F 1/133382
430/7

(Continued)

FOREIGN PATENT DOCUMENTS

JP 2003279954 A * 10/2003

OTHER PUBLICATIONS

English translation for JP-2003279954-A, Matsueda (Year: 2003).*

*Primary Examiner* — Michael H Caley
*Assistant Examiner* — Jonathan Y Jung

(57) ABSTRACT

A self-conducting light valve module includes: a first transparent graphene thermal conductive film, a panel frame, an LCD light valve, and a second transparent graphene thermal conductive film; wherein the panel frame has a first plane and a second plane at two ends, respectively; a rectangular through hole is drilled at a center of the panel frame, and the LCD light valve is installed in the rectangular through hole; the first transparent graphene thermally conductive film is attached to the first plane and the incident surface of the LCD light valve; and the second transparent graphene thermally conductive film is attached to the second plane and the emergent surface of the LCD light valve. A light valve heat dissipation device includes: a heat diffusion device installed on an external peripheral wall of the self-conducting light valve module.

10 Claims, 6 Drawing Sheets

(51) Int. Cl.
  *G03B 21/00*    (2006.01)
  *G03B 21/16*    (2006.01)
  *C08K 3/04*     (2006.01)
  *H05K 7/20*     (2006.01)
  *H05K 1/02*     (2006.01)

(52) U.S. Cl.
  CPC ........... *G03B 21/006* (2013.01); *G03B 21/16* (2013.01); *G02F 1/133385* (2013.01); *H05K 1/0204* (2013.01); *H05K 7/2039* (2013.01); *H05K 7/20963* (2013.01)

(56) References Cited

U.S. PATENT DOCUMENTS

2014/0017444 A1* 1/2014 Shimizu ................ H01B 5/00
                                                     428/131
2016/0377908 A1* 12/2016 Shin ................ G02F 1/133308
                                                      349/58
2018/0224691 A1*  8/2018 Wu ...................... G02F 1/1339
2020/0341358 A1* 10/2020 Hou ..................... G03B 21/16
2021/0063815 A1*  3/2021 Choi .................... G02B 27/01

* cited by examiner

SELF-CONDUCTING LIGHT VALVE MODULE AND LIGHT VALVE HEAT DISSIPATION DEVICE

CROSS REFERENCE OF RELATED APPLICATION

The present invention claims priority under 35 U.S.C. 119(a-d) to CN 202010159916.7, filed Mar. 9, 2020.

BACKGROUND OF THE PRESENT INVENTION

Field of Invention

The present invention relates to projector technologies, and more particularly to a self-conducting light valve module and a light valve heat dissipation device.

Description of Related Arts

When the lighting system of a projector illuminates the light valve, there is always a part of the light that is absorbed by the light valve and converted into Joule heat. The output brightness of the projector in the same optical system depends on how much light reaches the light valve. The higher the output brightness is required, the stronger the light irradiation should be on the light valve; and the stronger the light irradiation is, the more heat will be generated by the light valve. As a result, a stronger heat dissipation capacity is required to enable the light valve to work at a permitted temperature range. Whether the light valve can work normally or not depends entirely on the heat dissipation level thereof.

Relatively, the heat dissipation is most difficult for the light valve of an LCD projector, because heat dissipation function and light transmission function of the light valve overlap, which means the light valve performs not only heat dissipation, but also light transmission, so any opaque thermally conductive substance cannot be used to quickly conduct heat away by directly contacting the transparent surface of the light valves. There have already been technologies that use crystal glass to conduct heat by directly contacting the transparent surface of the light valve, but have very limited improvement in heat dissipation of the light valve, because thermal conductivity coefficient of the crystal glass, no matter in which direction, is low. Such technology provides no substantial improvement except for preventing local high-heat spot from damaging the light valve by equalizing the temperature to a certain extent. It even plays a negative role in heat dissipation of the LCD light valve which discharges heat through air cooling.

Conventional LCD projectors generally use forced air cooling to achieve light valve heat dissipation, wherein a fan directly blows transparent surfaces the light valve and the polarizer. Due to a relatively low heat transfer coefficient of the air cooling, a fixed heat exchange area, and temperature difference between the fluid (air) and the light valve which are constrained by the characteristics of the light valve and the working ambient temperature, the air cooling is inefficient. As a result, the light valve cannot adapt to stronger light irradiation, and the projector cannot afford higher brightness.

SUMMARY OF THE PRESENT INVENTION

An object of the present invention is to overcome the shortcomings of the prior art, and to provide a self-conducting light valve module and a light valve heat dissipation device. The present invention takes advantages of an ultra-high thermal conductivity coefficient of a graphene thermal film in the horizontal (in-plane) direction (which is up to 5000 W/m·k), to quickly conduct heat of an LCD (liquid-crystal display) light valve, thereby achieving efficient heat dissipation and temperature equalization for the LCD light valve, which effectively increases a service life of the LCD light valve, enables the LCD light valve to adapt to stronger light irradiation, creates necessary conditions for a projector to output higher brightness, significantly improves local color cast of an image white field, and increases user experience and satisfaction.

Accordingly, in order to accomplish the above object, the present invention provides a self-conducting light valve module, comprising: a first transparent graphene thermal conductive film, a panel frame, an LCD light valve, and a second transparent graphene thermal conductive film; wherein the panel frame has a first plane and a second plane at two ends, respectively; and the first plane is parallel to the second plane;

a rectangular through hole is drilled at a center of the panel frame, and dimensions of the rectangular through hole are no less than maximum external dimensions of a glass substrate of the LCD light valve; the LCD light valve is installed in the rectangular through hole; an incident surface of the LCD light valve is in a same plane as the first plane, and an emergent surface of the LCD light valve is in a same plane as the second plane;

the first transparent graphene thermally conductive film is attached to the first plane and the incident surface of the LCD light valve; and the second transparent graphene thermally conductive film is attached to the second plane and the emergent surface of the LCD light valve.

Preferably, a first notch group is provided in an area of the first transparent graphene thermal conductive film where the first transparent graphene thermal conductive film is attached to the first plane.

Preferably, a second notch group is provided in an area of the second transparent graphene thermal conductive film where the second transparent graphene thermal conductive film is attached to the second plane.

Preferably, an incident polarizer is attached to an external surface of the first transparent graphene thermal conductive film, or attached between the incident surface of the LCD light valve and the first transparent graphene thermal conductive film; the incident polarizer is opposite to the incident surface of the LCD light valve;

an emergent polarizer is attached to an external surface of the second transparent graphene thermal conductive film, or attached between the emergent surface of the LCD light valve and the second transparent graphene thermal conductive film; the emergent polarizer is opposite to the emergent surface of the LCD light valve.

Preferably, a reinforcement structure is provided at edges of the panel frame to increase mechanical strength of the panel frame. The reinforcement structure can be, but not limited to, a "T"-shape, an "L"-shape, or an "O"-shape.

Preferably, external dimensions of the first transparent graphene thermal conductive film are identical to external dimensions of the first plane; and external dimensions of the second transparent graphene thermal conductive film are identical to external dimensions of the second plane.

The present invention also provides a light valve heat dissipation device, comprising a self-conducting light valve module, and a heat diffusion device installed on an external peripheral wall of the self-conducting light valve module;

wherein heat of the self-conducting light valve module is transferred to the heat diffusion device, and then diffused into air by the heat diffusion device.

Preferably, the heat diffusion device comprises, but not limited to, a finned heat sink, a pipe heat sink, or a thermally conductive diffusion sheet.

Preferably, the heat diffusion device comprises a semiconductor cooling system.

Preferably, the semiconductor cooling system comprises an adapter plate, a semiconductor cooling sheet, and a heat sink; wherein the adapter plate is installed on the external peripheral wall of the self-conducting light valve module; a cold end of the semiconductor cooling sheet is connected to the adapter plate, and a hot end of the semiconductor cooling sheet is connected to the heat sink; the heat sink comprises, but not limited to, a finned heat sink, a pipe heat sink, or a thermally conductive diffusion sheet.

The beneficial effects of the present invention:

1. When the self-conducting light valve module of the present invention is placed in a light path of a projector, the LCD light valve will absorb part of the light and generate heat, wherein the first transparent graphene thermal conductive film and the second transparent graphene thermal conductive film can conduct the heat to edges thereof, as well as to the panel frame. The first transparent graphene thermal conductive film and the second transparent graphene thermal conductive film have ultra-high in-plane thermal conductivity coefficients, so the heat of the LCD light valve generated by absorbing light can be directly and quickly conducted to surfaces of the first transparent graphene thermal conductive film and the second transparent graphene thermal conductive film, and can be quickly transferred in an in-plane direction to the panel frame, which is conducive to rapid heat dissipation of the LCD light valve, thereby effectively improving a service life of the LCD light valve, and enabling the LCD light valve to adapt to stronger light irradiation.

2. The present invention can equalize temperatures of an entire transparent surface of the LCD light valve to a certain extent, so that temperature gradient differences within the transparent surface of the LCD light valve are reduced, and temperature distribution is more uniform, which can effectively improve output image brightness and color unevenness of the projector, leading to effective improvement in visual defects of image partial color cast, and increase of user satisfaction.

3. The notch groups are provided on the transparent graphene thermal conductive films of the present invention to avoid stress damage of the transparent graphene thermal conductive film after being heated and pressed by the external heat diffusion device, and to prevent the transparent graphene thermal conductive films from bending after being attached and during working.

4. When a horizontal thermal conductivity coefficient of the transparent graphene thermal conductive films of the present invention is ≥100 W/m·k, thermal conductivity coefficient and heat dissipation capacity of traditional air cooling are achieved. However, the horizontal thermal conductivity coefficient of the transparent graphene thermal conductive films of the present invention is ≥1000 W/m·k (a theoretical thermal conductivity coefficient of graphene is up to 5000 W/m·k), so the heat dissipation effect is far superior to that of the traditional air cooling. Furthermore, the present invention is simple in structure, highly cost effective, stable, and reliable.

BRIEF DESCRIPTION OF THE DRAWINGS

In order to explain embodiments of the present invention or technical solutions in the prior art more clearly, drawings involved in the embodiments or the prior art will be briefly introduced below. Obviously, the drawings in the following description are only some embodiments of the present invention. For those of ordinary skill in the art, without paying any creative work, other drawings may be obtained based on these drawings.

ELEMENT REFERENCE

Figure 1:
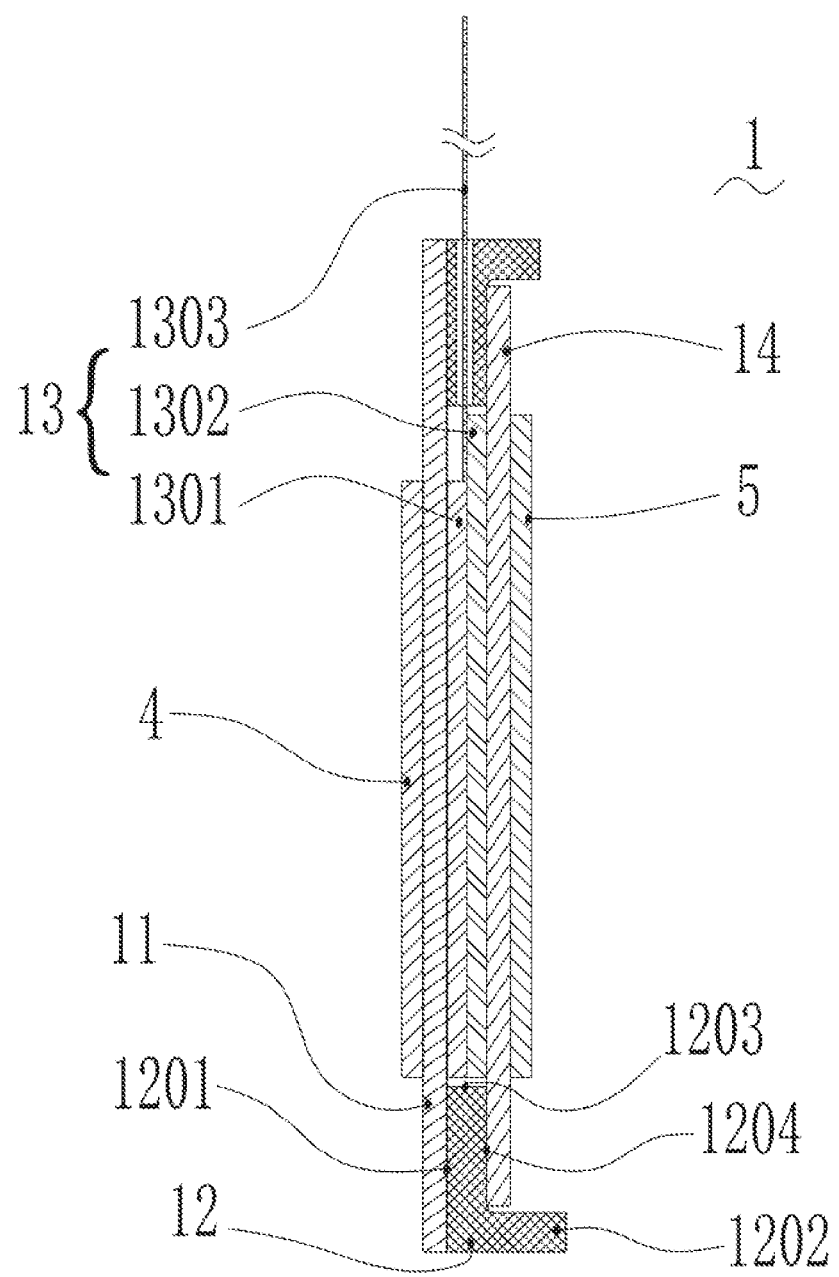
FIG. 1 is a cross-sectional view of a self-conducting light valve module of the present invention.

1—self-conducting light valve module, 11—first transparent graphene thermal conductive film, 1101—first notch group, 12—panel frame, 1201—first plane, 1202—reinforcement structure, 1203—rectangular through hole, 1204—second plane, 13—LCD light valve, 1301—incident glass, 1302—emergent glass, 1303—connecting cable, 14—second transparent graphene thermal conductive film, 1401—second notch group, 2—thermal diffusion device, 21—finned heat sink, 22—pipe heat sink, 23—thermally conductive diffusion sheet, 3—semiconductor cooling system, 31—adapter plate, 32—semiconductor cooling sheet, 33—heat sink, 4—incident polarizer, 5—emergent polarizer, 100—light valve heat dissipation device.

DETAILED DESCRIPTION OF THE PREFERRED EMBODIMENT

The present invention will be further illustrated below referring to, but not being limited to, the drawings, Referring to FIGS. 1-6, the present invention provides a self-conducting light valve module 1, comprising: a first transparent graphene thermal conductive film 11, a panel frame 12, an LCD light valve 13, and a second transparent graphene thermal conductive film 14; wherein the panel frame 12 has a first plane 1201 and a second plane 1204 at two ends, respectively; and the first plane 1201 is parallel to the second plane 1204;

a rectangular through hole 1203 is drilled at a center of the panel frame 12, and dimensions of the rectangular through hole 1203 are no less than maximum external dimensions of a glass substrate of the LCD light valve 13; the LCD light valve 13 is installed in the rectangular through hole 1203; an incident surface of the LCD light valve 13 is in a same plane as the first plane 1201, and an emergent surface of the LCD light valve 13 is in a same plane as the second plane 1204;

the first transparent graphene thermally conductive film 1 is attached to the first plane 1201 and the incident surface of the LCD light valve 13; and the second transparent graphene thermally conductive film 14 is attached to the second plane 1204 and the emergent surface of the LCD light valve 13.

When the self-conducting light valve module 1 of the present invention is placed in a light path of a projector, the LCD light valve 13 will absorb part of the light and generate heat, wherein the first transparent graphene thermal conductive film 11 and the second transparent graphene thermal conductive film 14 can conduct the heat to edges thereof, as well as to the panel frame 12. The first transparent graphene thermal conductive film 11 and the second transparent graphene thermal conductive film 14 have ultra-high in-plane thermal conductivity coefficients, so the heat of the LCD light valve 13 generated by absorbing light can be directly and quickly conducted to surfaces of the first transparent graphene thermal conductive film 11 and the second transparent graphene thermal conductive film 14, and can be quickly transferred in an in-plane direction to the panel frame 12, which is conducive to rapid heat dissipation of the LCD light valve 13, thereby effectively improving a service life of the LCD light valve 13, and enabling the LCD light valve 13 to adapt to stronger light irradiation.

According to the embodiment, the heat of the LCD light valve 13 is most generated at a central area. The first transparent graphene thermal conductive film 11 and the second transparent graphene thermal conductive film 14 can conduct the heat to edges thereof, as well as to the panel frame 12, so as to equalize temperatures of an entire transparent surface of the LCD light valve 13 to a certain extent. That is to say, a center temperature is decreased while edge temperatures are increased to some extend, so that temperature gradient differences within the transparent surface of the LCD light valve are reduced, and temperature distribution is more uniform, which can effectively improve output image brightness and color unevenness of the projector, leading to effective improvement in visual defects of image partial color cast, and increase of user satisfaction.

Preferably, length and width of the rectangular through hole 1203 are 0.005-1 mm larger than maximum external length and width of a glass substrate of the LCD light valve 13, respectively. Therefore, the LCD light valve 13 should be smoothly inserted into the rectangular through hole 1203 without too much space. Of course, the dimensions of the rectangular through hole 1203 are not limited to such preferred ranges, as long as the LCD light valve 13 can be fixed while being aligned to the planes of the panel frame 12.

Preferably, the LCD light valve 13 is fixed with glue after being installed in the rectangular through hole 1203 of the panel frame 12, so that the panel frame 12 and the LCD light valve 13 are integrated. The glue for fixing should not overflow onto the incident surface or the emergent surface of the LCD light valve 13, or the first plane 1201 or the second plane 1204 of the panel frame 12.

Preferably, the panel frame 12 may be made of, but not limited to, ADC12, 1100, or 6063 aluminum alloy material.

Preferably, external dimensions of the first transparent graphene thermal conductive film 11 are identical to external dimensions of the first plane 1201, in such a manner that a contour of the first transparent graphene thermal conductive film 11 is aligned with that of the first plane 1201 when the first transparent graphene thermal conductive film 11 is attached to the first plane 1201. External dimensions of the second transparent graphene thermal conductive film 14 are identical to external dimensions of the second plane 1204, in such a manner that a contour of the second transparent graphene thermal conductive film 14 is aligned with that of the first plane 1204 when the first transparent graphene thermal conductive film 11 is attached to the first plane 1204. Of course, the external dimensions of the first transparent graphene thermally conductive film 11 can also be smaller or larger than the external dimensions of the first plane 1201, and the external dimensions of the second transparent graphene thermally conductive film 14 can also be smaller or larger than the external dimensions of the second plane 1204, but both must be larger than the dimensions of the rectangular through hole 1203.

According to the embodiment, the LCD light valve 13 is an electro-optical imaging device, which comprises two attached and sealed glass substrates, wherein one of which is an incident glass 1301 with a color filter film formed on an internal surface, and the other is an emergent glass 1302 with a film transistor array formed on and a connecting cable 1303 bonded to an internal surface. Furthermore, a liquid crystal is sandwiched between the internal surfaces of both the incident glass 1301 and the emergent glass 1302. According to the embodiment, with the first transparent graphene thermal conductive film 11 and the second transparent graphene thermal conductive film 14, when the LCD light valve 13 absorbs light and thus generates heat, the heat is transferred to the first transparent graphene thermal conductive film 11 through an external surface of the incident glass 1301 of the LCD light valve 13; meanwhile, the heat is also transferred to the second transparent graphene thermal conductive film 14 through an external surface of the emergent glass 1302. The heat is conducted in in-plane directions of the first transparent graphene thermally conductive film 11 and the second transparent graphene thermally conductive film 14 toward the edges thereof, and thus reaches the panel frame 12 and its vicinity.

According to the embodiment, preferably, a first notch group 1101 is provided in an area of the first transparent graphene thermal conductive film 11 where the first transparent graphene thermal conductive film 11 is attached to the first plane 1201. Preferably, an opening ratio of the first notch group 1101 in the area is 520%, but is not limited to greater than, less than or equal to 20%. The first notch group 1101 prevents the first transparent graphene thermal conductive film 11 from bending after being heated and pressed.

According to the embodiment, preferably, a second notch group 1401 is provided in an area of the second transparent graphene thermal conductive film 14 where the second transparent graphene thermal conductive film 14 is attached to the second plane 1204. Preferably, an opening ratio of the second notch group 1401 in the area is ≤20%, but is not limited to greater than, less than or equal to 20%. The second notch group 1401 prevents the second transparent graphene thermal conductive film 14 from bending after being heated and pressed.

According to the embodiment, preferably, a reinforcement structure 1202 is provided at edges of the panel frame 12 to increase mechanical strength of the panel frame 12, thereby improving reliability thereof. The reinforcement structure 1202 can be, but not limited to, a "T"-shape, an "L"-shape, or an "O"-shape.

According to the embodiment, preferably, an incident polarizer 4 is attached to an external surface of the first transparent graphene thermal conductive film 11, and the incident polarizer 4 is opposite to the incident surface of the LCD light valve 13; an emergent polarizer 5 is attached to an external surface of the second transparent graphene thermal conductive film 14, and the emergent polarizer 5 is opposite to the emergent surface of the LCD light valve 13.

Certainly, the incident polarizer 4 can be attached between the incident surface of the LCD light valve 13 and the first transparent graphene thermal conductive film 11, and the emergent polarizer 5 can be attached between the emergent surface of the LCD light valve 13 and the second transparent graphene thermal conductive film 14. That is to say, the incident polarizer 4 can be attached between the external surface of the incident glass 1301 of the LCD light valve 13 and the first transparent graphene thermal conductive film 11, and the emergent polarizer 5 can be attached between the external surface of the emergent glass 1302 of the LCD light valve 13 and the second transparent graphene thermal conductive film 14. At this time, a thickness between the first plane 1201 and the second plane 1204 on the panel frame 12 needs to be added with a thickness of the incident polarizer 4 and the emergent polarizer 5 to keep the first transparent graphene thermal conductive film 11 and the second transparent graphene thermal conductive film 14 aligned to the planes of the panel frame (12).

According to the embodiment, the incident polarizer 4 and the emergent polarizer 5 absorb light and thus generate heat. The first transparent graphene thermal conductive film 11 and the second transparent graphene thermal conductive film 14 conduct the to the edges thereof as well as to the panel frame 12, which is conducive to rapid heat dissipation of the incident polarizer 4 and the emergent polarizer 5, and enlarges service lives of the incident polarizer 4 and the emergent polarizer 5.

Embodiment 2

Referring to FIGS. 1-6, the present invention provides a light valve heat dissipation device 10, comprising a self-conducting light valve module 1 described above, and a heat diffusion device 2 installed on an external peripheral wall of the self-conducting light valve module 1; wherein heat of the self-conducting light valve module 1 is transferred to the heat diffusion device 2, and then diffused into air by the heat diffusion device 2.

According to the embodiment 2, the LCD light valve 13, the incident polarizer 4 and the emergent polarizer 5 absorb light and generate heat, wherein the heat can be directly and quickly conducted to surfaces of the first transparent graphene thermal conductive film 11 and the second transparent graphene thermal conductive film 14, and can be quickly transferred in an in-plane direction to the panel frame 12, and then diffused into air by the heat diffusion device 2, which is conducive to rapid heat dissipation of the LCD light valve 13, the incident polarizer 4 and the emergent polarizer 5, thereby effectively improving service lives of the LCD light valve 13, the incident polarizer 4 and the emergent polarizer 5, and enabling the LCD light valve 13 to adapt to stronger light irradiation.

According to the embodiment 2, the first notch group 1101 and the second notch group 1401 can prevent stress failure caused by the heat diffusion facility 2 when pressing the first transparent graphene thermally conductive film 11 and the second transparent graphene thermally conductive film 14, thereby effectively protecting the first transparent graphene thermal conductive film 11 and a second transparent graphene thermal conductive film 14.

When a horizontal thermal conductivity coefficient of the transparent graphene thermal conductive films of the present invention is ≥100 W/m·k, thermal conductivity coefficient and heat dissipation capacity of traditional air cooling are achieved. However, the horizontal thermal conductivity coefficient of the transparent graphene thermal conductive films of the embodiment 2 is ≥1000 W/m·k (a theoretical thermal conductivity coefficient of graphene is up to 5000 W/m·k), so the heat dissipation effect is far superior to that of the traditional air cooling. Furthermore, the present invention is simple in structure, highly cost effective, stable, and reliable.

Figure 2:
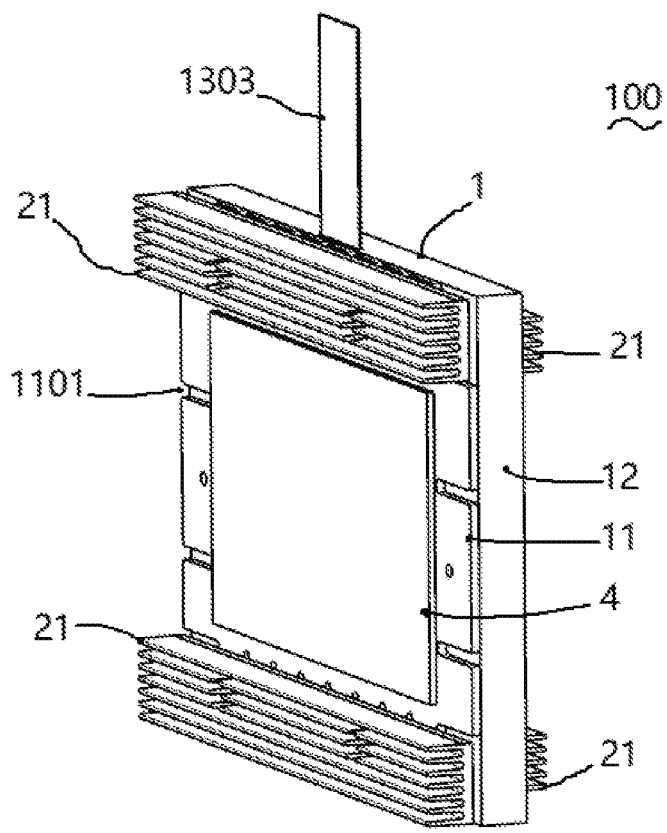
FIG. 2 is a perspective view of an embodiment of the present invention.
Figure 3:
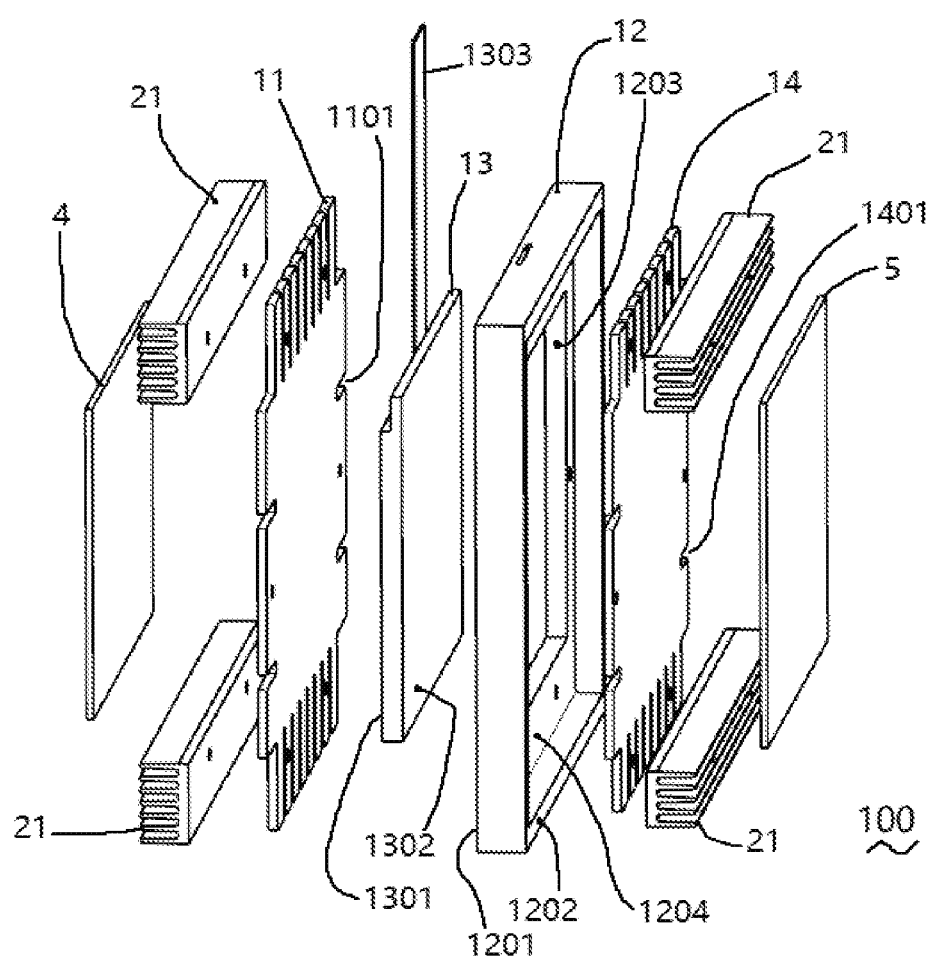
FIG. 3 is an exploded view of FIG. 2.
Figure 4:
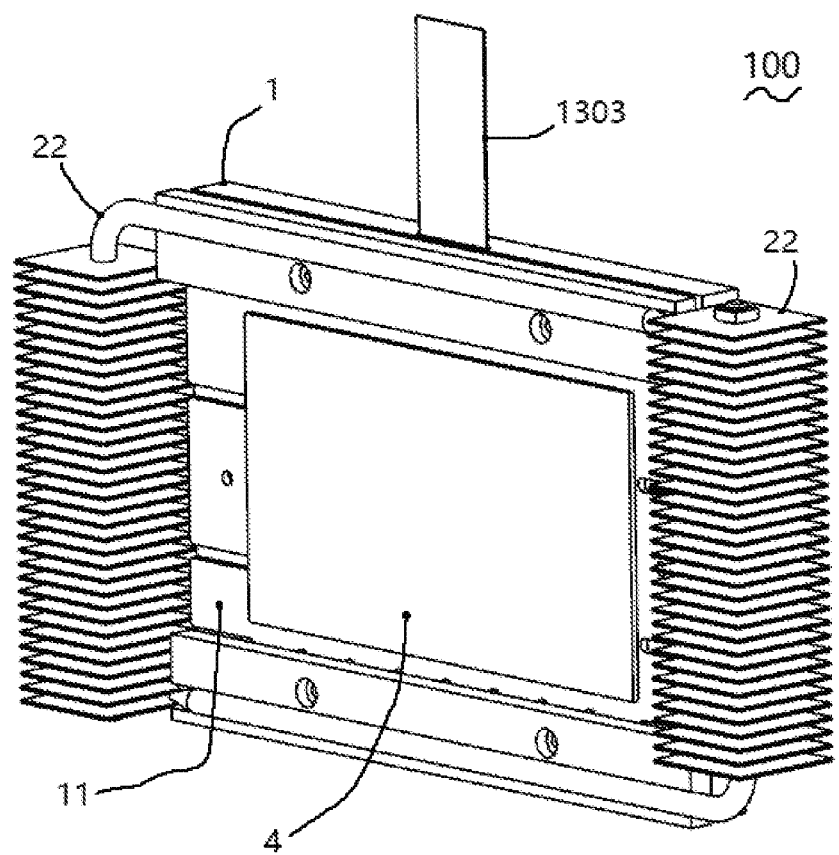
FIG. 4 is a perspective view of another embodiment of the present invention.
Figure 5:
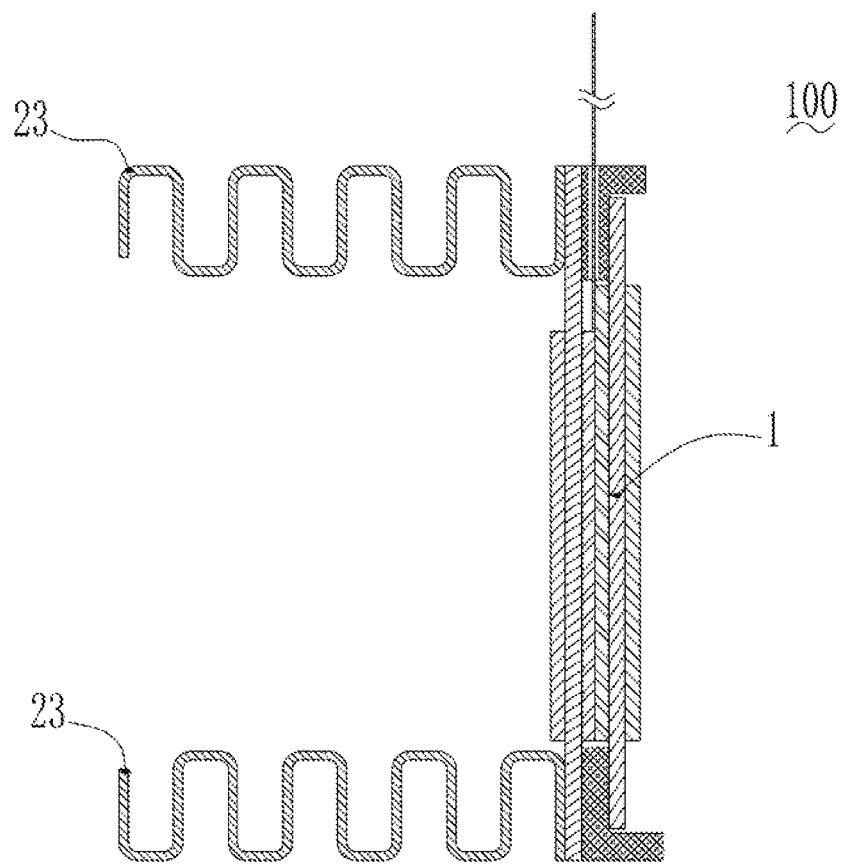
FIG. 5 is a structural view of another embodiment of the present invention.

According to the embodiment 2, the heat diffusion device 2 has a structure as follows:

I. The heat diffusion device 2 adopts, but not limited to, a finned heat sink 21 (as shown in FIGS. 2 and 3), a pipe heat sink 22 (as shown in FIG. 4), or a thermally conductive diffusion sheet 23 (as shown in FIG. 5), in such a manner that the heat of the LCD light valve 13, the incident polarizer 4 and the emergent polarizer 5 can be quickly diffused into the air.

Airflow layouts of the finned heat sink 21, the pipe heat sink 22, and the thermally conductive diffusion sheet 23 should be designed according to air duct and air beam flow direction of the projector, to reduce noise of the light valve heat dissipation device 100 of the embodiment 2 and improve heat dissipation efficiency.

Preferably, the thermally conductive diffusion sheet 23 may be, but not limited to, a graphene thermally conductive sheet having an in-plane thermal conductivity coefficient ≥2500 W/m·k, which may also adopt materials with high thermal conductivity coefficient such as thermally conductive graphite sheets, aluminum, and copper.

Figure 6:
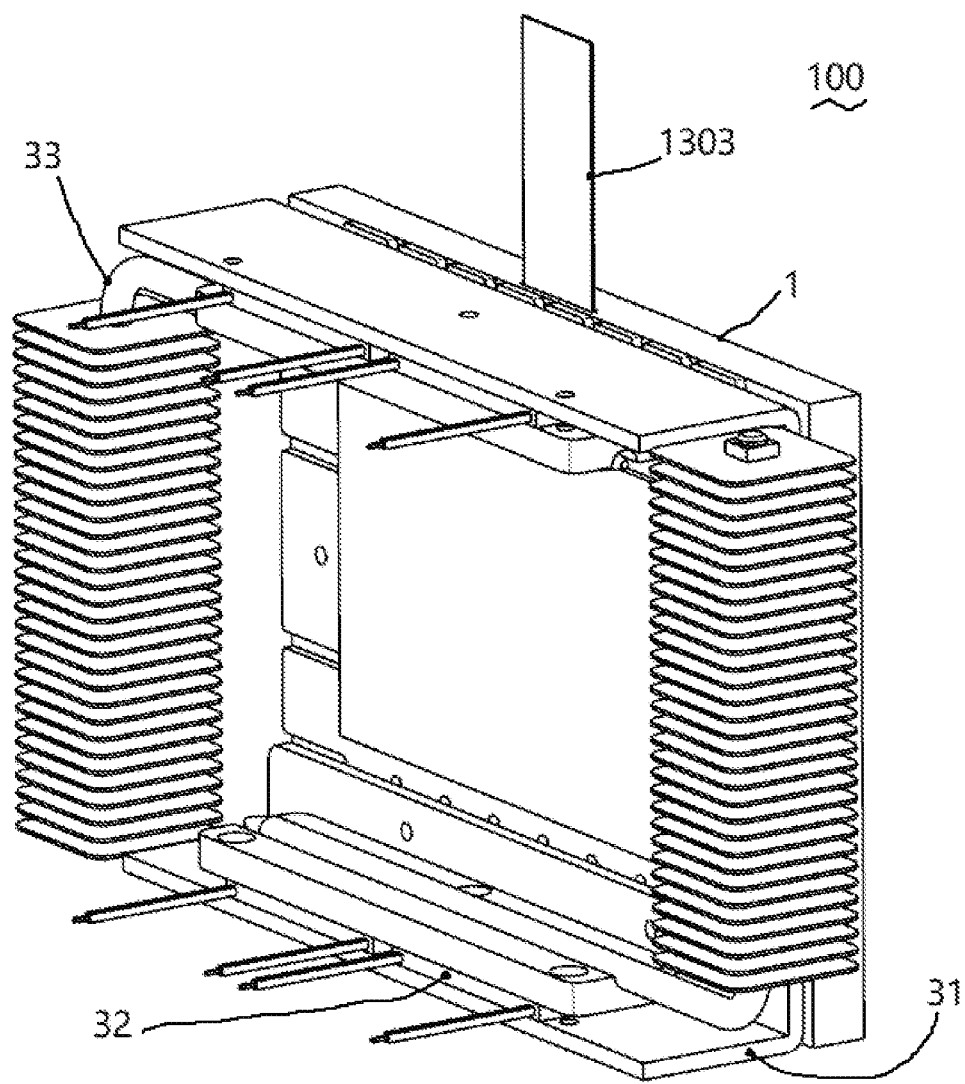
FIG. 6 is a perspective view of a semiconductor cooling system installed in the present invention.

II. Referring to FIG. 6, the heat diffusion device 2 comprises a semiconductor cooling system 3 installed on an external peripheral wall of the self-conducting light valve module 1. The semiconductor cooling system 3 comprises an adapter plate 31, a semiconductor cooling sheet 32, and a heat sink 33; wherein the adapter plate 31 is installed on the external peripheral wall of the self-conducting light valve module 1; a cold end of the semiconductor cooling sheet 32 is connected to the adapter plate 31, and a hot end of the semiconductor cooling sheet 32 is connected to the heat sink 33. The heat of the LCD light valve 13, the incident polarizer 4 and the emergent polarizer 5 is quickly diffused into the air by semiconductor cooling system 3.

Preferably, the heat sink 33 comprises, but not limited to, a finned heat sink, a pipe heat sink, or a thermally conductive diffusion sheet.

Preferably, the adapter plate 31 is made of, but not limited to, a metal material with a thermal conductivity coefficient of more than 200 W/m·k.

According to the embodiment 2, contacting surfaces of the adapter plate 31, the semiconductor cooling plate 32, and the heat sink 33 are coated with thermal grease to effectively reduce contact thermal resistances. At the same time, it is necessary to effectively prevent the adapter plate 31 and the heat sink 33 from thermal bridge short circuit which reduces heat dissipation effects.

The basic principles, main features and advantages of the present invention are shown and described above. Those skilled in the art should understand that the present invention is not limited by the above-mentioned embodiments, since the above-mentioned embodiments and the description only describe the principles of the present invention. Modifications and improvements can be made to the present invention without departing from the spirit and scope of the present invention. Such modifications and improvements will all fall within the scope of the claimed invention. The claimed protection scope of the present invention is defined by the appended claims and their equivalents.

What is claimed is:

1. A self-conducting light valve module, comprising: a first transparent graphene thermal conductive film, a panel frame, an LCD light valve, and a second transparent graphene thermal conductive film; wherein the panel frame has a first plane and a second plane at two ends, respectively; and the first plane is parallel to the second plane;

a rectangular through hole is drilled at a center of the panel frame, and dimensions of the rectangular through hole are no less than maximum external dimensions of a glass substrate of the LCD light valve; the LCD light valve is installed in the rectangular through hole; an incident surface of the LCD light valve is in a same plane as the first plane, and an emergent surface of the LCD light valve is in a same plane as the second plane;

the first transparent graphene thermally conductive film is attached to the first plane and the incident surface of the LCD light valve; and the second transparent graphene thermally conductive film is attached to the second plane and the emergent surface of the LCD light valve.

2. The self-conducting light valve module, as recited in claim 1, wherein a first notch group is provided in an area of the first transparent graphene thermal conductive film where the first transparent graphene thermal conductive film is attached to the first plane.

3. The self-conducting light valve module, as recited in claim 1, wherein a second notch group is provided in an area of the second transparent graphene thermal conductive film where the second transparent graphene thermal conductive film is attached to the second plane.

4. The self-conducting light valve module, as recited in claim 1, wherein an incident polarizer is attached to an external surface of the first transparent graphene thermal conductive film, or attached between the incident surface of the LCD light valve and the first transparent graphene thermal conductive film; the incident polarizer is opposite to the incident surface of the LCD light valve;

an emergent polarizer is attached to an external surface of the second transparent graphene thermal conductive film, or attached between the emergent surface of the LCD light valve and the second transparent graphene thermal conductive film; the emergent polarizer is opposite to the emergent surface of the LCD light valve.

5. The self-conducting light valve module, as recited in claim 1, wherein a reinforcement structure is provided at edges of the panel frame.

6. The self-conducting light valve module, as recited in claim 1, wherein external dimensions of the first transparent graphene thermal conductive film are identical to external dimensions of the first plane; and external dimensions of the second transparent graphene thermal conductive film are identical to external dimensions of the second plane.

7. A light valve heat dissipation device, comprising a self-conducting light valve module, and a heat diffusion device installed on an external peripheral wall of the self-conducting light valve module; wherein heat of the self-conducting light valve module is transferred to the heat diffusion device, and then diffused into air by the heat diffusion device;

wherein the self-conducting light valve module comprises: a first transparent graphene thermal conductive film, a panel frame, an LCD (liquid-crystal display) light valve, and a second transparent graphene thermal conductive film; wherein the panel frame has a first plane and a second plane at two ends, respectively; and the first plane is parallel to the second plane;

a rectangular through hole is drilled at a center of the panel frame, and dimensions of the rectangular through hole are no less than maximum external dimensions of a glass substrate of the LCD light valve; the LCD light valve is installed in the rectangular through hole; an incident surface of the LCD light valve is in a same plane as the first plane, and an emergent surface of the LCD light valve is in a same plane as the second plane;

the first transparent graphene thermally conductive film is attached to the first plane and the incident surface of the LCD light valve; and the second transparent graphene thermally conductive film is attached to the second plane and the emergent surface of the LCD light valve.

8. The light valve heat dissipation device, as recited in claim 7, wherein the heat diffusion device comprises a finned heat sink, a pipe heat sink, or a thermally conductive diffusion sheet.

9. The light valve heat dissipation device, as recited in claim 7, wherein the heat diffusion device comprises a semiconductor cooling system.

10. The light valve heat dissipation device, as recited in claim 9, wherein the semiconductor cooling system comprises an adapter plate, a semiconductor cooling sheet, and a heat sink; wherein the adapter plate is installed on the external peripheral wall of the self-conducting light valve module; a cold end of the semiconductor cooling sheet is connected to the adapter plate, and a hot end of the semiconductor cooling sheet is connected to the heat sink.

* * * * *